United States Patent [19]

Schroeder

[11] Patent Number: 4,933,747

[45] Date of Patent: Jun. 12, 1990

[54] INTERCONNECT AND COOLING SYSTEM FOR A SEMICONDUCTOR DEVICE

[75] Inventor: Jack A. Schroeder, Scottsdale, Ariz.

[73] Assignee: Motorola Inc., Schaumburg, Ill.

[21] Appl. No.: 329,056

[22] Filed: Mar. 27, 1989

[51] Int. Cl.⁵ .......................................... H01L 23/46
[52] U.S. Cl. ...................................... 357/82; 357/81; 357/79
[58] Field of Search ............................. 357/82, 81, 79

[56] References Cited

U.S. PATENT DOCUMENTS

| | | | |
|---|---|---|---|
| 4,341,432 | 7/1982 | Cutchaw | 361/385 |
| 4,381,032 | 2/1983 | Cutchaw | 165/46 |
| 4,442,450 | 4/1984 | Lipschutz et al. | 357/79 |
| 4,479,140 | 10/1984 | Horvath | 357/79 |
| 4,531,146 | 6/1985 | Cutchaw | 357/82 |
| 4,581,679 | 4/1986 | Smolley | 361/393 |
| 4,612,978 | 9/1986 | Cutchaw | 361/385 |
| 4,647,959 | 3/1987 | Smith | 357/79 |
| 4,733,172 | 3/1988 | Smolley | 324/158 F |

FOREIGN PATENT DOCUMENTS

| | | |
|---|---|---|
| 0213151 | 12/1984 | Japan . |
| 0092642 | 5/1985 | Japan . |
| 0220954 | 11/1985 | Japan . |
| 0047653 | 3/1986 | Japan . |
| 0056944 | 3/1988 | Japan ........................ 357/82 |

OTHER PUBLICATIONS

Horvath, "Cooling Assembly for Solder-Bonded Semiconductor Devices", IBM TDB, vol. 27, No. 7A, Dec./84, p. 3915.
Siwy, Jr. et al, "Thermally Enhanced Semiconductor Chip Packaging Structure", vol. 21, No. 1, 6/78, p. 185.
Stackhouse, "Module with Heat Sink Between Substrate and Circuit Board", vol. 22, No. 4, 9/79, pp. 1428-1429.

Primary Examiner—Andrew J. James
Assistant Examiner—Viet Q. Nguyen
Attorney, Agent, or Firm—Joe E. Barbee

[57] ABSTRACT

An interconnect and cooling system has a housing which encloses a semiconductor device which is cooled by a pressurized coolant. The pressurized coolant exerts a force on the semiconductor device and holds it with a constant compressive force against a circuit board. Upon removal of the pressure the housing can be opened to easily and quickly replace the semiconductor device.

9 Claims, 2 Drawing Sheets

INTERCONNECT AND COOLING SYSTEM FOR A SEMICONDUCTOR DEVICE

BACKGROUND OF THE INVENTION

This invention relates, in general, to semiconductor devices, and more particularly, to an interconnect and cooling system for semiconductor devices.

As semiconductor devices become larger in physical size, heat dissipation becomes a problem. In addition, it would be desirable to provide an assembly that permits quick connect, disconnect, and replacement of semiconductor devices in an assembly.

Accordingly, it is an object of the present invention to provide an assembly which simultaneously provides cooling while maintaining a good connection between a semiconductor device and a circuit board.

Another object of the present invention is to provide a cooling assembly which does not allow the coolant to come in contact with the semiconductor device.

Yet another object of the present invention is to provide an interconnect and cooling system which allows easy replacement of a semiconductor device Yet a further object of the present invention is to provide an interconnect and cooling system for a semiconductor device that uses either a cooling gas or a cooling liquid.

SUMMARY OF THE INVENTION

The above and other objects and advantages of the present invention are provided by a housing having a first portion and a second portion for enclosing a semiconductor device. The first portion has a recessed area. A circuit board is supported on the second portion. A semiconductor device is positioned on the circuit board with an interconnecting means located in between the semiconductor device and the circuit board. A diaphragm is then placed over the semiconductor device. When the first portion is mated with the second portion the recess encloses the semiconductor device. The first portion has an input and an output for allowing a pressurized coolant to enter the recessed area and exert a pressure on the diaphragm and remove heat from the semiconductor device which is conducted through the diaphragm. The pressure on the diaphragm presses down on the semiconductor device and the interconnect means thereby making contact between the semiconductor device and the circuit board.

DETAILED DESCRIPTION OF THE DRAWINGS

Figure 1:
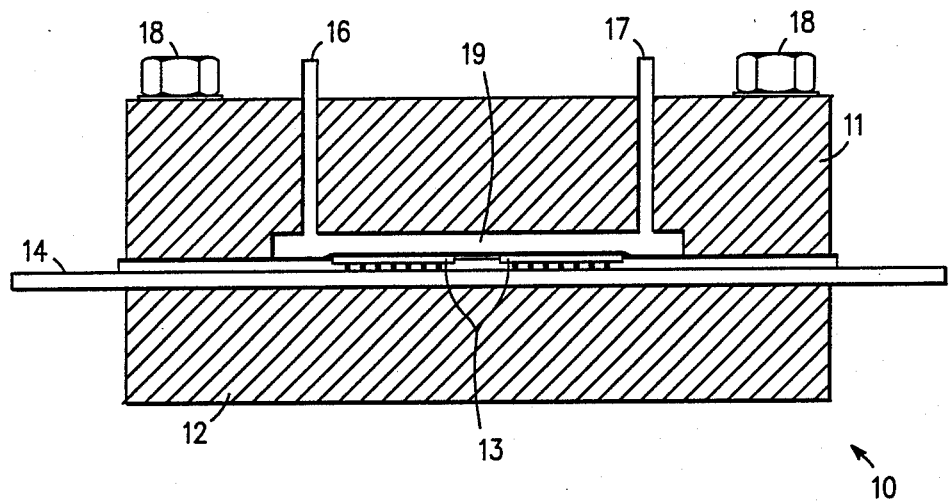
FIG. 1 illustrates an embodiment of the present invention.

FIG. 1 is a cross-sectional view of an interconnect and cooling system 10 Upper portion 11 has a recess 19 and mates with a lower portion 12. Upper portion 11 and lower portion 12 are held together by clamping screws 18 which clamp down on circuit board 14 extending from housing 10. Illustrated in recess 19 are two semiconductor devices 13. An inlet 16 allows a coolant to enter recess 19 and exit through outlet 17. The coolant can be any suitable cooling media such as a cooling liquid, a cooling fluid, cold air, or the like. The coolant exerts a force against semiconductor device 13.

Figure 2:
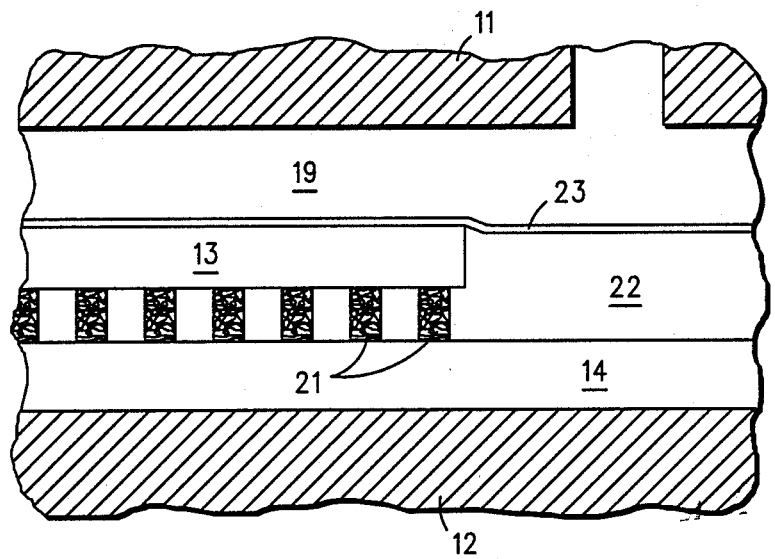
FIG. 2 is an enlarged view of a portion of the system of FIG. 1.

FIG. 2 is an enlarged view of a portion of the system illustrated in FIG. 1. A pressure diaphragm 23 is positioned over semiconductor device 13 and serves to separate semiconductor device 13 from the cooling media within cavity or recess 19 and to transmit force generated by the cooling media to semiconductor device 13. Located below semiconductor device 13 are a plurality of fuzz buttons 21 which provide interconnection to circuit board 14. Fuzz buttons 21 are held in a holder 22. Circuit board can be a printed circuit board, multilayer ceramic interconnect assembly, or the like.

Figure 3:
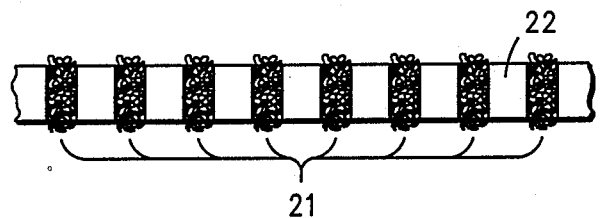
FIG. 3 is a cross-section of a small portion of interconnect means used in the present invention.

FIG. 3 illustrates a portion of holder 22 with a fuzz button 21. Fuzz button 21 is made of crumpled wire. The wire can be made from nickel and gold plated spring steel. In a preferred embodiment, fuzz button 21 fits in a 0.02 centimeter hole. Holder 22 can be made from any suitable plastic. Holder 22 containing fuzz buttons 21 can be purchased from Cinch Connector Division, Oak Grove, Ill.

Figure 4:
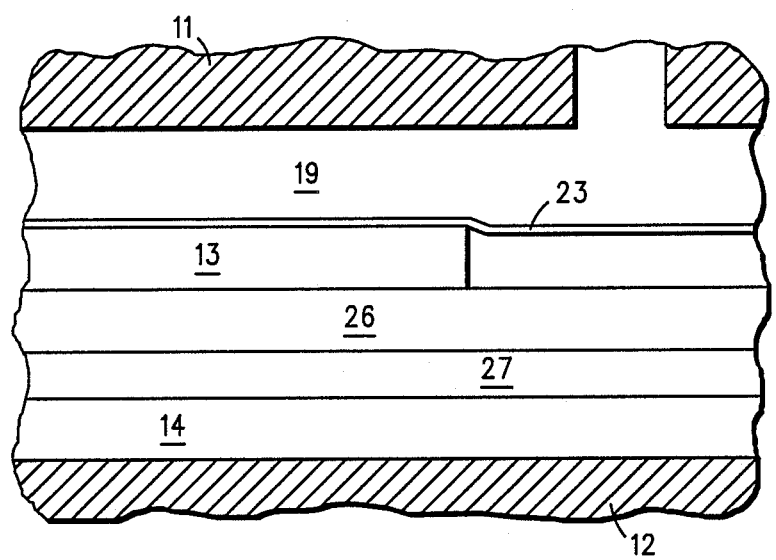
FIG. 4 is an enlarged view of a portion of another embodiment of the present invention.

FIG. 4 illustrates, in enlarged form, a small portion of the housing of FIG. 1 with another embodiment of an interconnect means. The interconnect means illustrated in FIG. 4 does not require fuzz buttons. This configuration utilizes an elastomeric connector 26 along with circuit interconnector 27. Circuit interconnector 27 is an interface connector between elastomeric connector 26 and circuit board 14. The purpose of interconnector 27 is to provide a good interface between elastomeric connector 26 and circuit board 14 because of the configuration of elastomeric connector 26. Circuit interconnector 27 may be optional particularly if circuit board 14 is designed in a manner to accept direct interface with elastomeric connector 26. Circuit interconnector 27 is a layer having electrical connections from the top side to the bottom side.

Diaphragm 23 is formed to fit over semiconductor device 13. If interconnect means are not required to connect semiconductor device 13 to circuit board 14, diaphragm 23 can be formed to hold semiconductor device 13 in place. In addition, semiconductor device 13 can be directly bonded to pressure diaphragm 23 to accurately hold semiconductor device 13 in place. Pressure diaphragm 23 can be made from any suitable material such as thin copper, beryllium copper, or any suitable material that transfers heat from semiconductor device 13 to the cooling material or coolant that is passed under pressure through recess or cavity 19.

Figure 5:
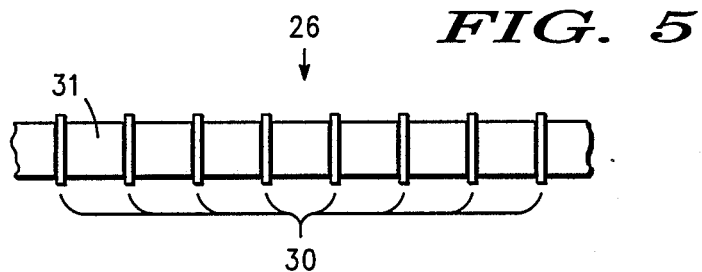
FIG. 5 is an enlarged cross-section of a small portion of another interconnect means.

FIG. 5 illustrates an enlarged view of a portion of elastomeric connector 26. A plurality of thin wires 30 are embedded in a connector sheet 31. Connector sheet 31 can be any suitable material such as a silicon rubber. Whereas wires 30 are very thin and therefore require circuit interconnector 27 (as shown in FIG. 4) to provide proper electrical connection to circuit board 14. Elastomeric connector 26 can be purchased from Shin-Etsu, located in Union City, Calif. as an anisotropic connector sheet.

The interconnect means can be as illustrated or any combination thereof. As illustrated in FIG. 1, interconnect means may be a direct connection between semiconductor die 13 and circuit board 14. In some applications it may be desirable to use a combination of fuzz buttons 21 in combination with elastomeric connector 26.

By now it should be appreciated that there has been provided an interconnect and cooling system having a housing that encloses a semiconductor device to be cooled. A pressurized coolant is used which exerts pressure on the semiconductor device through a diaphragm in order to firmly hold the semiconductor device in electrical contact with a circuit board. A constant compressive force or pressure is exerted on the connectors or contacts to ensure a good electrical contact. This force is in the order of 50 to 100 pounds per square inch of semiconductor die area. Upon removal of the pressure, the housing can be opened to easily and quickly replace the semiconductor device.

I claim:

1. An interconnect and cooling system for a semiconductor device, comprising: a housing having a bottom portion and a top portion, the top portion having a recess for accommodating the semiconductor device; a circuit board for receiving the semiconductor device; compressive interconnect means positioned between the semiconductor device and the circuit board for providing an electrical interconnect therebetween; and a pressure diaphragm positioned over the semiconductor die so that the recess in the top portion of the housing forms a cavity over a portion of the pressure diaphragm covering the semiconductor device, wherein the top portion has means for conveying a pressurized coolant into the cavity that cools the semiconductor device and exerts pressure on the diaphragm to maintain electrical contact between the circuit board and the semiconductor device through the compressive interconnect means.

2. The interconnect and cooling system of claim 1 wherein the recess in the top portion accommodates a plurality of semiconductor devices.

3. The interconnect and cooling system of claim 1 wherein the compressive interconnect means is a plurality of thin wires embedded in a resilient material.

4. An electrical interconnect and cooling system for an electrical circuit, comprising: a housing having a first portion which mates with a second portion wherein the first portion has a recess and means for providing a pressurized cooling media to the recess; a circuit board positioned on the second portion; interconnect means positioned over the circuit board with the electrical circuit positioned over the interconnect means; and a diaphragm means positioned over the electrical circuit so that the pressurized cooling media exerts a force on the diaphragm to compress the interconnect means between the electrical circuit and the circuit board thereby providing electrical connection between the electrical circuit and the circuit board while the cooling media removes heat from the electrical circuit through the diaphragm.

5. The electrical interconnect and cooling system of claim 4 wherein the cooling media is a liquid.

6. The electrical interconnect and cooling system of claim 4 wherein the cooling media is a pressurized fluid.

7. The electrical interconnect and cooling system of claim 4 wherein the means for providing a pressurized cooling media includes an input and an output for the cooling media.

8. The electrical interconnect and cooling system of claim 4 wherein the interconnect means includes a sheet of plastic having crumpled wire inserted through holes in the sheet of plastic.

9. The electrical interconnect and cooling system of claim 8 wherein the interconnect means further includes a circuit interconnector to interface between the sheet of plastic and the circuit board.

* * * * *